(12) United States Patent
Frougier et al.

(10) Patent No.: US 10,573,755 B1
(45) Date of Patent: Feb. 25, 2020

(54) NANOSHEET FET WITH BOX ISOLATION ON SUBSTRATE

(71) Applicant: International Business Machines Corporation, Armonk, NY (US)

(72) Inventors: Julien Frougier, Albany, NY (US); Kangguo Cheng, Schenectady, NY (US); Nicolas Loubet, Guilderland, NY (US); Ruilong Xie, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/128,869

(22) Filed: Sep. 12, 2018

(51) Int. Cl.
*H01L 29/786* (2006.01)
*H01L 29/66* (2006.01)
(Continued)

(52) U.S. Cl.
CPC .. *H01L 29/78609* (2013.01); *H01L 21/02532* (2013.01); *H01L 21/02603* (2013.01);
(Continued)

(58) Field of Classification Search
CPC ......... H01L 29/78609; H01L 29/78618; H01L 29/78651; H01L 29/42392; H01L 29/0673; H01L 29/0649; H01L 29/66545; H01L 29/66742; H01L 29/78696; H01L 21/76895; H01L 21/7624; H01L 21/02532; H01L 21/02603; H01L 23/535
See application file for complete search history.

(56) References Cited

U.S. PATENT DOCUMENTS 7,029,964 B2 4/2006 Cheng et al.
8,513,067 B2 8/2013 Huang et al.
(Continued)

OTHER PUBLICATIONS

Lee et al., "MsS2 Nanosheet Phototransistors with Thickness-Modulated Optical Energy Gap", Nano Letters, 2012, pp. 3695-3700.
(Continued)

*Primary Examiner* — Sitaramarao S Yechuri
(74) *Attorney, Agent, or Firm* — Cantor Colburn LLP; Joseph Petrokaitis

(57) ABSTRACT

A method of fabricating a nanosheet semiconductor device includes depositing sacrificial material on a layer of silicon germanium (SiGe) above a substrate. A thickness of the sacrificial material is more than a thickness of the layer of SiGe. The method also includes forming nanosheet fins comprising alternating silicon (Si) nanosheets and silicon germanium (SiGe) layers on the sacrificial material, undercutting the SiGe layers to form divots, and forming a dummy gate structure above each of the nanosheet fins. A first liner is deposited to fill the divots and cover the nanosheet fins and the dummy gate structure. The sacrificial material and the first liner material are removed. The method also includes encapsulating the nanosheet fins and the dummy gate structure with a conformal liner, and performing an oxide fill to create a buried oxide (BOX) isolation between subsequently formed source and drain regions between the nanosheet fins and the substrate.

19 Claims, 15 Drawing Sheets

(51) Int. Cl.
*H01L 21/02* (2006.01)
*H01L 21/762* (2006.01)
*H01L 23/535* (2006.01)
*H01L 29/06* (2006.01)
*H01L 29/423* (2006.01)
*H01L 21/768* (2006.01)

(52) U.S. Cl.
CPC .... *H01L 21/7624* (2013.01); *H01L 21/76895* (2013.01); *H01L 23/535* (2013.01); *H01L 29/0649* (2013.01); *H01L 29/0673* (2013.01); *H01L 29/42392* (2013.01); *H01L 29/66545* (2013.01); *H01L 29/66742* (2013.01); *H01L 29/78618* (2013.01); *H01L 29/78651* (2013.01); *H01L 29/78696* (2013.01)

(56) References Cited

U.S. PATENT DOCUMENTS

| | | | |
|---|---|---|---|
| 8,765,563 | B2 | 7/2014 | Pillarisetty et al. |
| 8,778,768 | B1 | 7/2014 | Chang et al. |
| 9,012,284 | B2 | 4/2015 | Glass et al. |
| 9,048,087 | B2 | 6/2015 | Wu et al. |
| 9,276,064 | B1 * | 3/2016 | Zang ................... H01L 29/0673 |
| 9,287,357 | B2 | 3/2016 | Rodder et al. |
| 9,865,735 | B2 | 1/2018 | Sun et al. |
| 9,870,940 | B2 | 1/2018 | Wang et al. |
| 9,899,269 | B2 | 2/2018 | Ching et al. |
| 9,947,804 | B1 | 4/2018 | Frougier et al. |
| 2004/0108558 | A1 * | 6/2004 | Kwak ................... H01L 29/0653 257/410 |
| 2013/0161618 | A1 * | 6/2013 | Botula ................ H01L 21/2652 257/49 |
| 2014/0061799 | A1 * | 3/2014 | Fan .................... H01L 29/42384 257/347 |
| 2015/0295084 | A1 | 10/2015 | Obradovic et al. |
| 2016/0071729 | A1 | 3/2016 | Hatcher et al. |
| 2017/0110554 | A1 * | 4/2017 | Tak ..................... H01L 29/4991 |
| 2018/0040695 | A1 | 2/2018 | Smith et al. |
| 2018/0047707 | A1 | 2/2018 | Or-Bach et al. |
| 2018/0083000 | A1 | 3/2018 | Goktepeli |

OTHER PUBLICATIONS

Reboh et al., "Strain, strees, and mechanical relaxation of fin-patterned Si/SiGe multilayers for sub-7 nm nanosheet gate-all-around device technology", App. Phys. Lett. 112, 2018, pp. 1-6.

* cited by examiner

NANOSHEET FET WITH BOX ISOLATION ON SUBSTRATE

BACKGROUND

The present invention relates to a semiconductor device, and more specifically, to a nanosheet field effect transistor (FET) with buried oxide (BOX) isolation on the substrate.

Nanosheet FETs are semiconductor devices that offer a structure that promises to facilitate the pursuit for reduced gate sizes below 7 nanometers (nm), 5 nm, and beyond. The smaller transistors allow higher performance and lower power consumption. The channel region between the source and drain regions is defined by horizontal silicon sheets, called nanosheets or a nanosheet stack. A fin FET, which has a channel region defined by a fin, is an example of a tri-gate FET, because the gate contacts three surfaces (top and two sides) of the fin-shaped channel. The nanosheet FET is a gate-all-around FET, because the gate contacts all four surfaces of each of the nanosheets in the stack that defines the channel region.

SUMMARY

Embodiments of the present invention are directed to a nanosheet semiconductor device and methods of fabricating a nanosheet semiconductor device. The method includes depositing sacrificial material on a layer of silicon germanium (SiGe) above a substrate. The thickness of the sacrificial material is more than a thickness of the layer of SiGe. The method also includes forming nanosheet fins comprising alternating silicon (Si) nanosheets and silicon germanium (SiGe) layers on the sacrificial material, undercutting the SiGe layers to form divots at a first end and a second end of each of the nanosheet fins, forming a dummy gate structure above each of the nanosheet fins, and depositing a first liner to fill the divots and conformally cover the nanosheet fins and the dummy gate structure. The sacrificial material is removed, and the first liner material is removed after removal of the sacrificial material. The method additionally includes encapsulating the nanosheet fins and the dummy gate structure with a conformal liner, and performing an oxide fill to create a buried oxide (BOX) isolation between subsequently formed source and drain regions between the nanosheet fins and the substrate.

BRIEF DESCRIPTION OF THE DRAWINGS

The examples described throughout the present document will be better understood with reference to the following drawings and description. The components in the figures are not necessarily to scale. Moreover, in the figures, like-referenced numerals designate corresponding parts throughout the different views.

FIGS. 2-30 show the process flow of the fabrication of a nanosheet FET with buried oxide (BOX) isolation on the substrate according to one or more embodiments of the invention, in which:

FIG. 2 shows a nanosheet stack formed on a substrate with a sacrificial silicon layer therebetween;

FIG. 3 shows a cross-sectional view of an intermediate structure resulting from spacer deposition and dummy gate formation;

FIG. 4 shows a different cross-sectional view of the intermediate structure shown in FIG. 3;

FIG. 5 shows the result of a partial etch of the sacrificial silicon layer;

FIG. 6 shows a different aspect of the intermediate structure shown in FIG. 5;

FIG. 7 shows inner spacer indents between the silicon sheets of the nanosheet stack;

FIG. 8 indicates that the inner spacer indents are not visible in the cross-sectional view along the gate;

FIG. 9 shows an intermediate structure with inner spacers in the indents and a conformal liner;

FIG. 10 shows intermediate structure shown in FIG. 9 with the same cross-sectional view along the gate as FIG. 8 and indicates the liner above the dummy gate structure;

FIG. 11 shows the result of etching the liner on the surface of the sacrificial silicon layer and above the dummy gate;

FIG. 12 shows a different perspective of the intermediate structure shown in FIG. 11 and shows the removal of the liner above the dummy gate structure;

FIG. 13 is an intermediate structure that shows a result of removing the sacrificial silicon layer;

FIG. 14 shows a view of the intermediate structure shown in FIG. 13 that also shows removal of the sacrificial silicon layer below the nanosheet stack;

FIG. 15 shows the result of removing the remainder of the conformal liner;

FIG. 16 is a different view of the intermediate structure shown in FIG. 15;

FIG. 17 shows another conformal liner that encapsulates the silicon nanosheet fins and dummy gate structure;

FIG. 18 shows a different cross-sectional view of the intermediate structure shown in FIG. 17 and indicates the conformal liner below the nanosheet stack;

FIG. 19 shows the intermediate structure that results from an oxide fill;

FIG. 20 shows that the intermediate structure shown in FIG. 19 also includes the oxide fill inside the conformal liner below the nanosheet stack;

FIG. 21 is an intermediate structure that results from a recess of the oxide fill and an etch of the encapsulating liner;

FIG. 22 shows a different cross-sectional view of the intermediate structure shown in FIG. 21 and shows the removal of the liner above the dummy gate structure;

FIG. 23 shows a result of forming source/drain regions;

FIG. 24 shows a view between the source/drain regions of the intermediate structure shown in FIG. 23;

FIG. 25 is an intermediate structure resulting from an oxide fill;

FIG. 26 shows a view of the intermediate structure shown in FIG. 25 that also shows removal of layers of the dummy gate structure;

FIG. 27 shows the result of replacing the dummy gate structure with the gate;

FIG. 28 shows a view of the intermediate structure shown in FIG. 27 and clarifies that the gate surrounds each silicon sheet of the nanosheet structure;

FIG. 29 is a structure that results from formation of contacts above the source/drain regions; and FIG. 30 shows a view of the structure shown in FIG. 29 between the source/drain regions and contacts.

DETAILED DESCRIPTION

Figure 2:
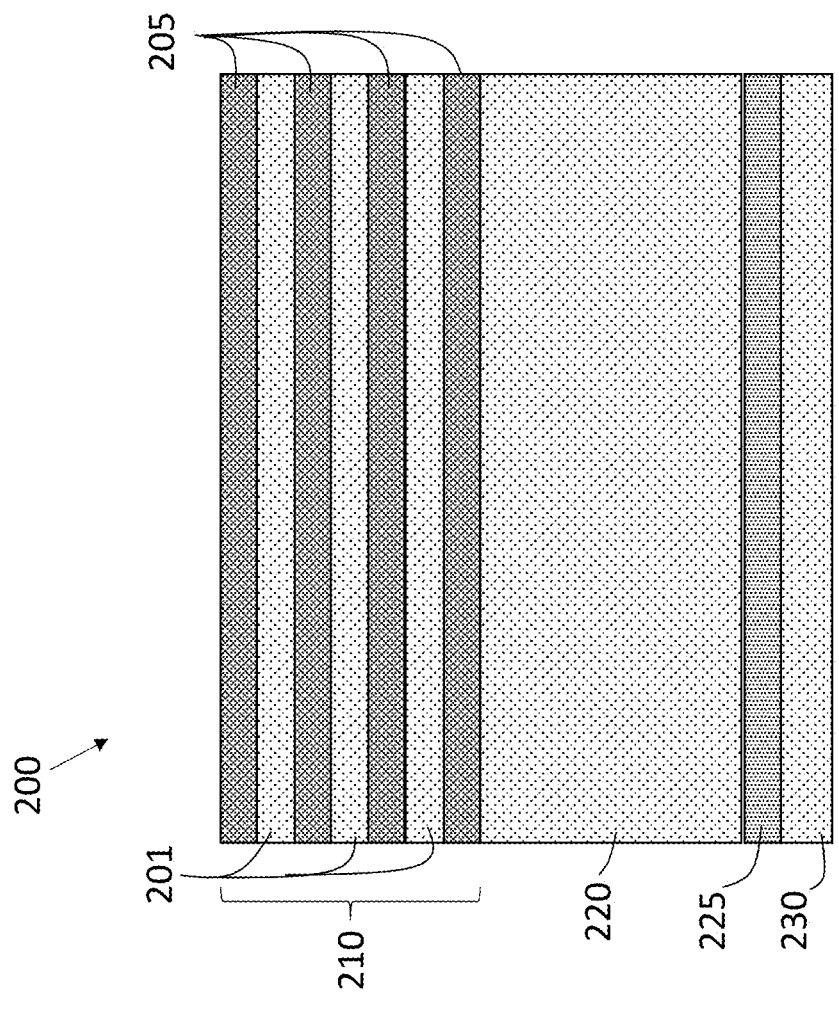

It is understood in advance that although this invention includes a detailed description of exemplary gate-all-around (GAA) nanosheet FET architectures having silicon (Si)

channel nanosheets and SiGe sacrificial nanosheets, embodiments of the invention are not limited to the particular FET architectures or materials described in this specification. Rather, embodiments of the present invention are capable of being implemented in conjunction with any other type of nanosheet/nanowire FET architecture or materials now known or later developed. In this detailed description and in the claims, the terms nanosheet and nanowire are treated as being synonymous.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an IC having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

MOSFET-based ICs are fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of nanosheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets can be SiGe and the sacrificial nanosheets can be Si. In some implementations, the channel nanosheet of a p-type FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer CMOS technology and below. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si.

Although nanosheet channel FET architectures provide increased device density over planar FET architectures, there are still challenges when attempting to fabricate nanosheet channel FETs that provide the performance characteristics required for a particular application. For example, when the source and drain regions are formed directly on the substrate on which the nanosheet stack is also formed, undesirable parasitic current leakage can occur below the bottom nanosheet (the one closest to the substrate) of the stack. This parasitic current negatively affects the performance of the transistor. A prior approach to addressing this leakage has included using a silicon germanium (SiGe) layer with a high percentage of Ge (e.g., 65% Ge) as a placeholder for dielectric isolation. However, this limits the dielectric isolation thickness to being on the order of 15 nm. As a result, this poses a narrow process margin for downstream processes to ensure prevention of a breach of the dielectric isolation.

Turning now to an overview of aspects of the invention, embodiments of the invention address the above-described shortcomings of the prior art with buried oxide (BOX) isolation on the substrate. The BOX isolation facilitates a lower percentage of Ge in the SiGe layer and provides improved isolation between the source and drain regions and the substrate. As a result, parasitic current in the channel region is prevented.

Figure 1:
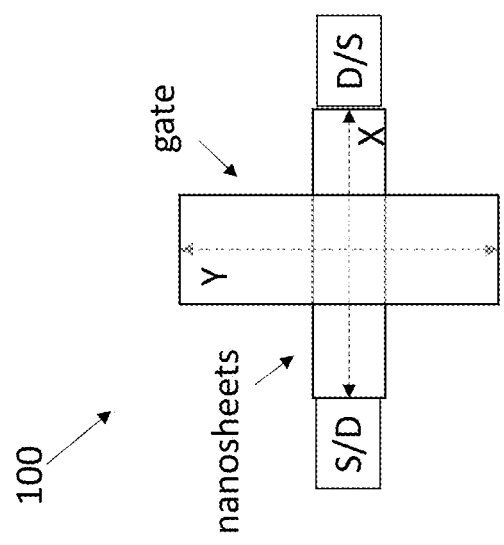
FIG. 1 depicts an overhead view of a nanosheet field effect transistor (FET) that is fabricated according to one or more embodiments of the invention.

FIG. 1 depicts an overhead view of a nanosheet FET 100 that is fabricated according to one or more embodiments of the invention. The view in FIG. 1 shows the structure resulting from a nanosheet stack forming a channel between a source and drain. As indicated, a perpendicular gate is formed over and around the nanosheets. In the subsequent figures, cross-sectional views are shown both along the nanosheets (in the x dimension, as indicated) and along the gate (in the y dimension, as indicated). As the subsequent figures indicate, the addition of a sacrificial silicon layer 210 (FIG. 2) facilitates the ultimate formation of the buried oxide (BOX) layer, SiO2 1910 (FIG. 19), that serves to isolate the source/drain regions 2310 (FIG. 23) from the substrate 230 (FIG. 2).

FIGS. 2 to 30 show aspects of the process flow used to fabricate the nanosheet FET 100 with BOX isolation on the substrate according to one or more embodiments of the invention. FIG. 2 shows a structure 200 with a nanosheet stack 210 formed on a sacrificial silicon (Si) layer 220 according to one or more embodiments. The nanosheet stack 210 includes alternating layers of Si sheets 201 and is initially formed with silicon germanium (SiGe) suspensions 205 between the Si sheets 201. The Si sheets 201 can be on the order of 8 nanometers (nm) in thickness, and the SiGe suspensions 205 can be on the order of 9 nm in thickness. The sacrificial Si layer 220 can be on the order of 50 to 100 nm such that it is relatively much thicker than the layers of the nanosheet stack 210. The sacrificial Si layer 220 is formed on a SiGe layer 225. In an exemplary embodiment, while the SiGe suspensions 205 of the nanosheet stack 210 can be 35 percent (%) Ge, the SiGe layer 225 can be 25% Ge. The SiGe layer 225 can also have a thickness on the order of 5 nm and be formed on a Si substrate 230. The SiGe layer 225 and sacrificial Si layer 220 are different from the conventional structure used in the formation of a conventional nanosheet FET.

Figure 4:
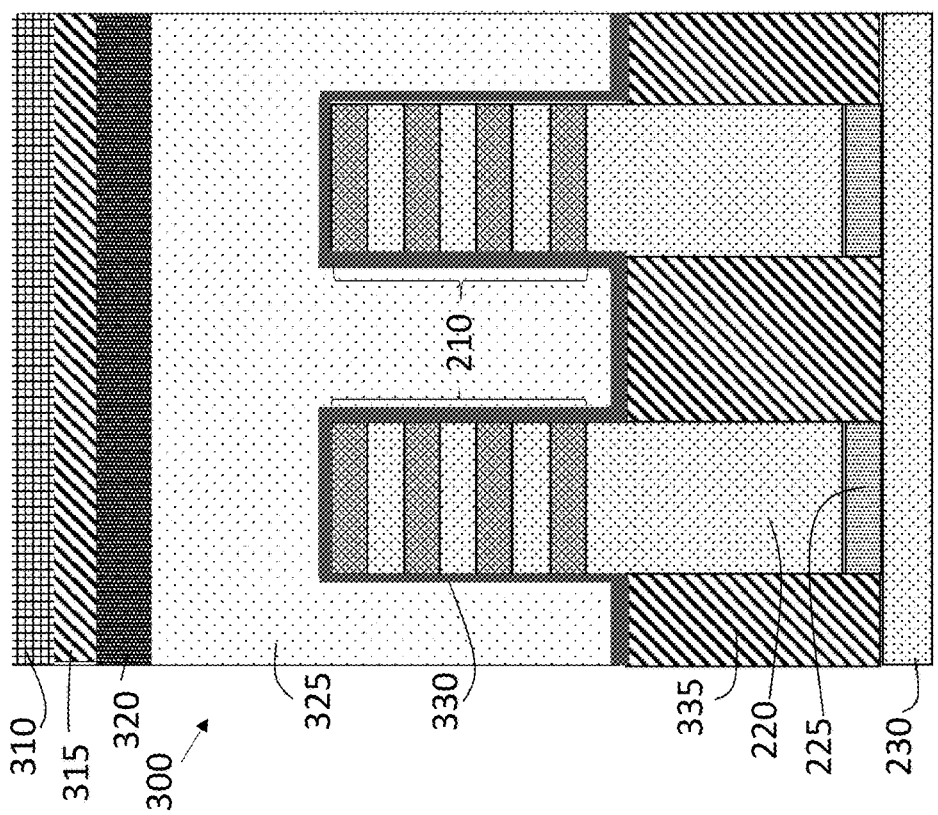
Figure 3:
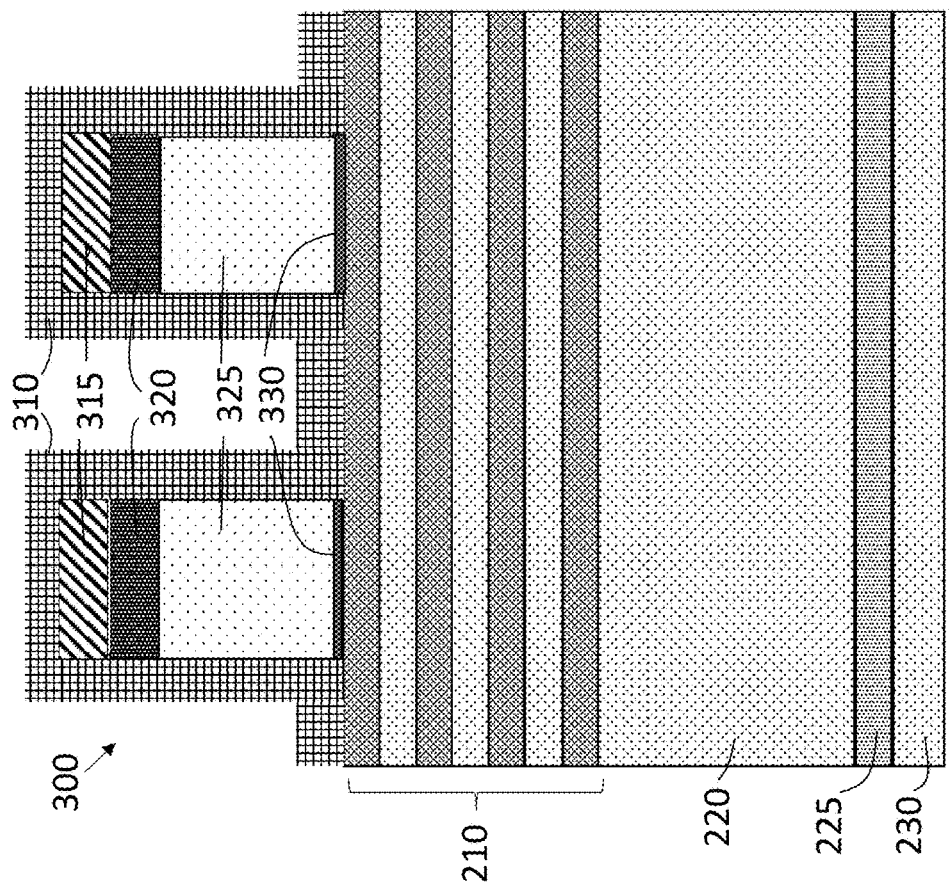

FIG. 3 shows a structure 300 following spacer 310 deposition on a dummy gate structure according to one or more embodiments of the invention. The structure 300 is shown along the nanosheet stack 210 (in the x dimension, as indicated in FIG. 1) in FIG. 3. A conformal spacer 310 is formed on dummy gates, which are formed as fins, as shown. The fins include a hard mask that includes a silicon oxide (SiO) layer 315 and a silicon nitride (SiN) layer 320 on amorphous Si (a-Si) 325 formed on a thin layer of oxide 330. The oxide 330 is a sacrificial oxide such as silicon dioxide (SiO$_2$) or silicon oxynitride (SiON). The fins are formed on the nanosheet stack 210. The spacer 310 material is silicon-boron-carbon-nitrogen (SiBCN) according to an exemplary embodiment. FIG. 4 shows different aspects of the structure 300 shown in FIG. 3. In FIG. 4, the structure 300 is shown along the gate 2740 (FIG. 28) (in the y dimension, as indicated in FIG. 1). FIG. 4 shows a shallow trench isolation (STI) region 335 between the sacrificial Si layers 220. The STI region 335 can include SiO$_2$ or can be a bilayer such as SiN/SiO$_2$.

Figure 6:
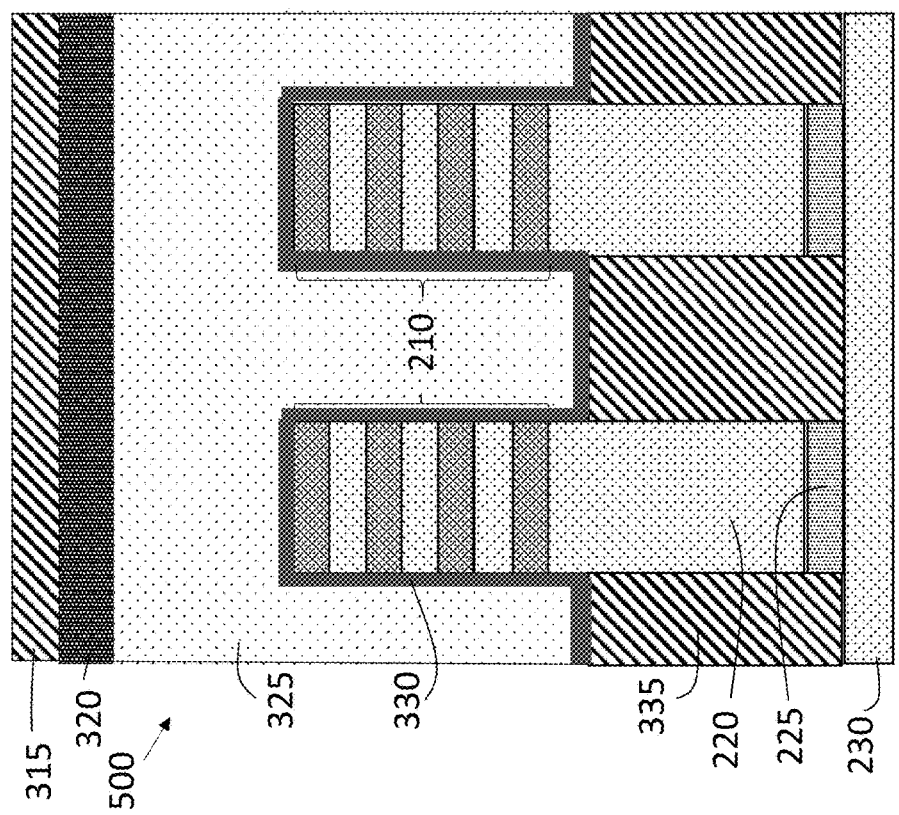
Figure 5:
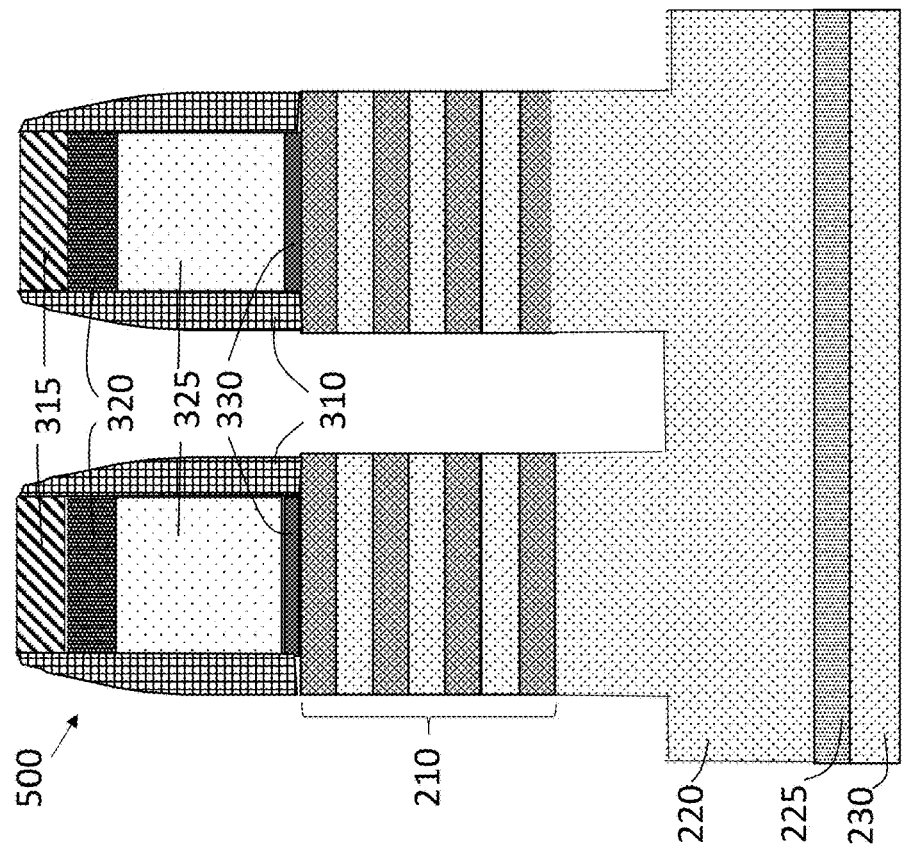

FIG. 5 shows a structure 500 following a partial etch of the sacrificial Si layer 220 according to one or more embodiments of the inventions. A reactive ion etch (ME) process is used to etch the spacers 310. As FIG. 5 indicates, an overetch is performed to also remove portions of the nanosheet stack 210 and sacrificial Si layer 220. FIG. 6 shows aspects of the structure 500 shown in FIG. 5. From the perspective shown in FIG. 6 and in comparison with the structure 300 shown in FIG. 4, only the top spacer layer 310 is shown removed by the RIE process.

Figure 8:
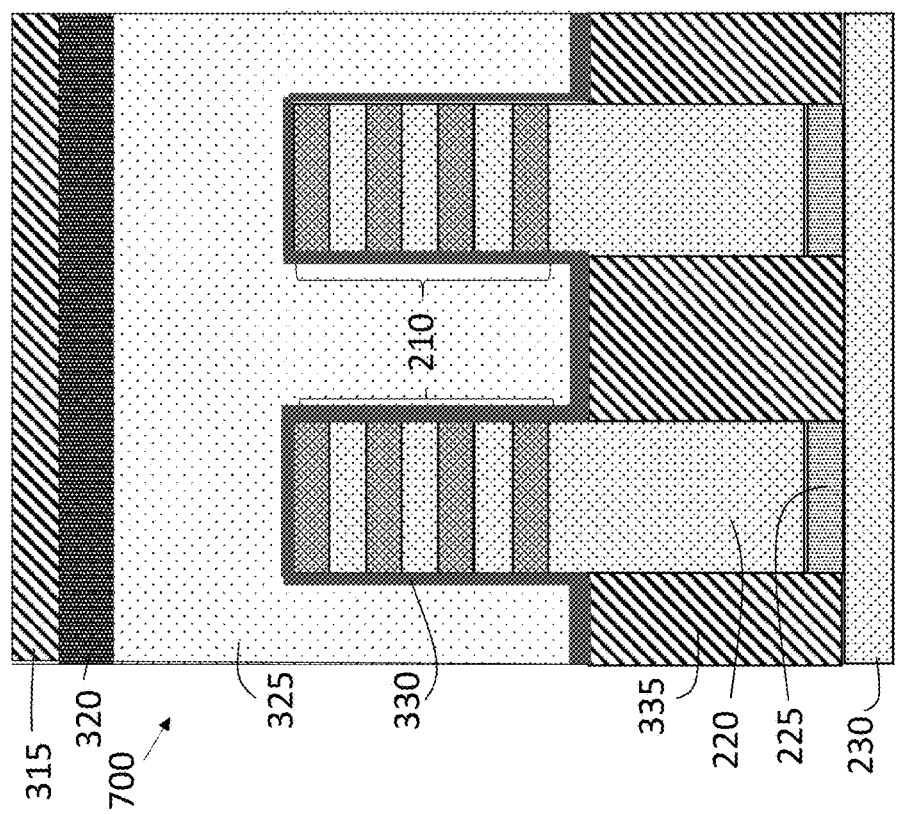
Figure 7:
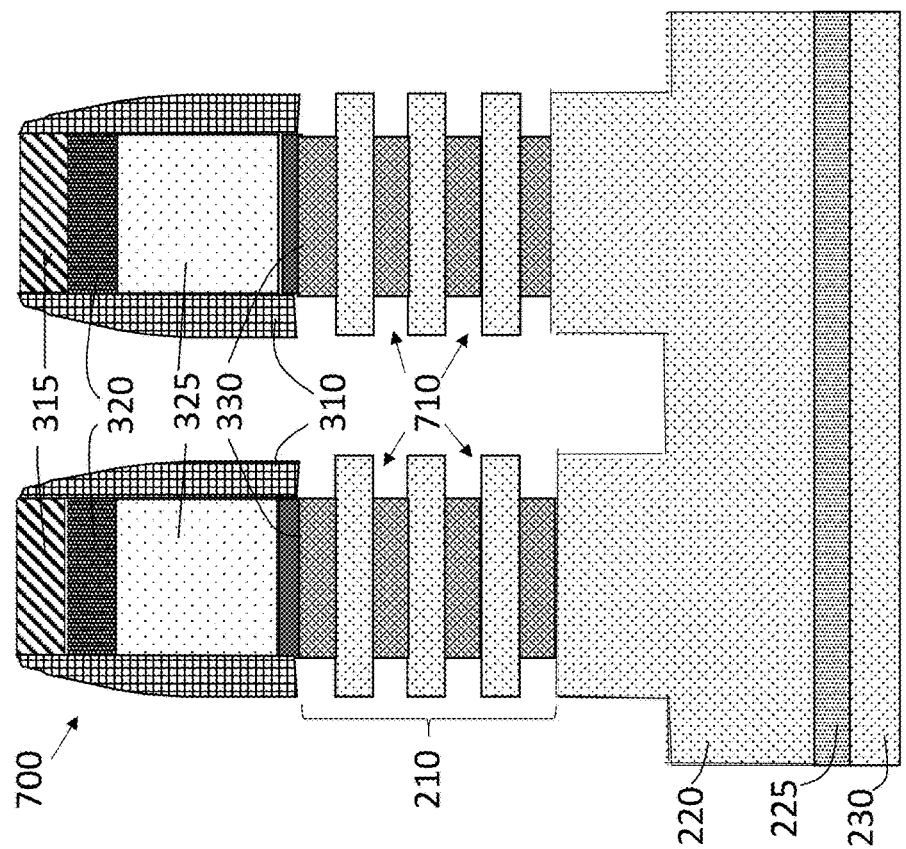

FIG. 7 shows a structure 700 that results from a selective etch of the nanosheet stacks 210 according to one or more embodiments of the invention. The selective etch can be performed with a wet process at 40 degrees Celsius, for example. The selective etch process results in inner spacer indents or divots 710, as shown. FIG. 8 shows aspects of the structure 700 shown in FIG. 7. As a comparison of FIGS. 6 and 8 indicates, there is no change from the perspective along the gate 2740 (FIG. 28) based on the selective etch to form the divots 710.

Figure 10:
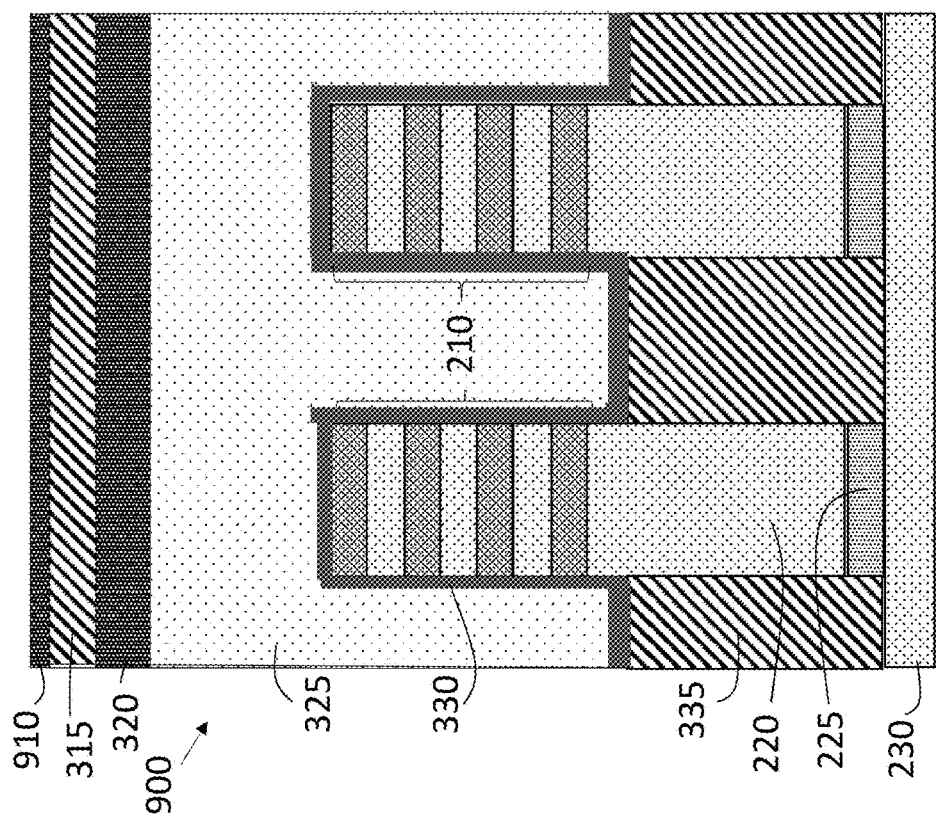
Figure 9:
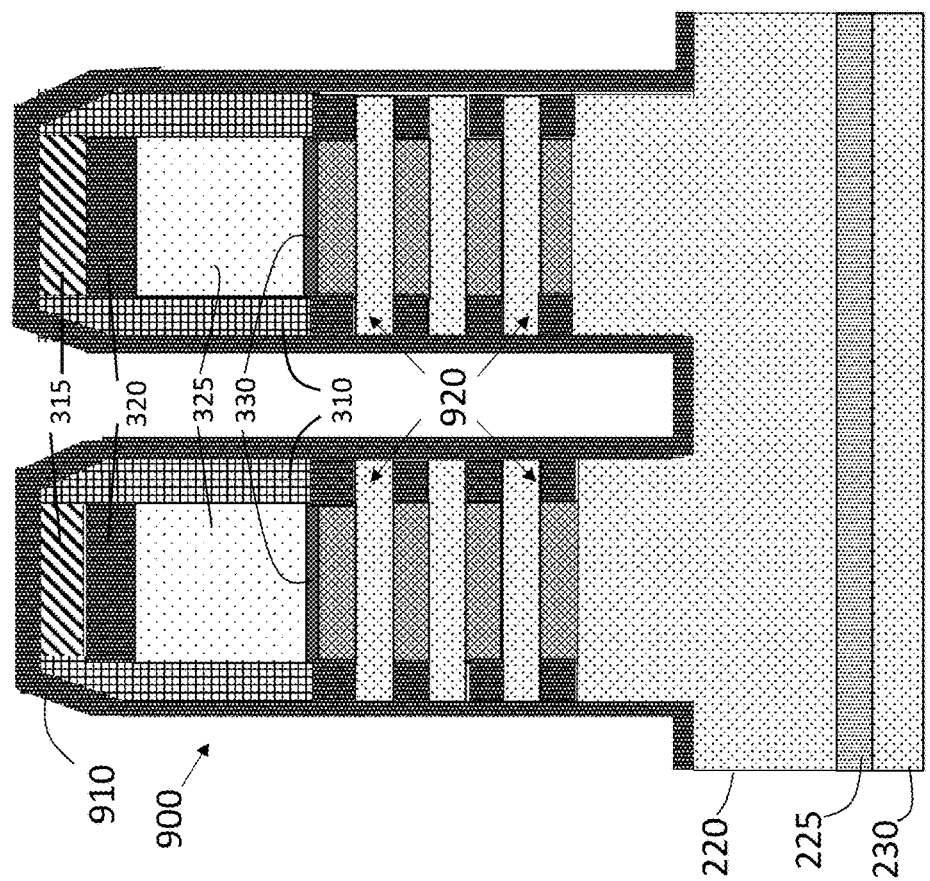

FIG. 9 shows the structure 900 that results from formation of inner spacers 920 according to one or more embodiments of the invention. As FIG. 9 indicates, the inner spacers 920 are formed in the divots 710. The inner spacers 920 can be comprised of SiN. A conformal iRAD SiN liner 910 is also deposited over the structure 700 shown in FIG. 7. FIG. 10 shows aspects of the structure 900 shown in FIG. 9. The SiN liner 910 is formed on the SiO layer 315.

Figure 11:
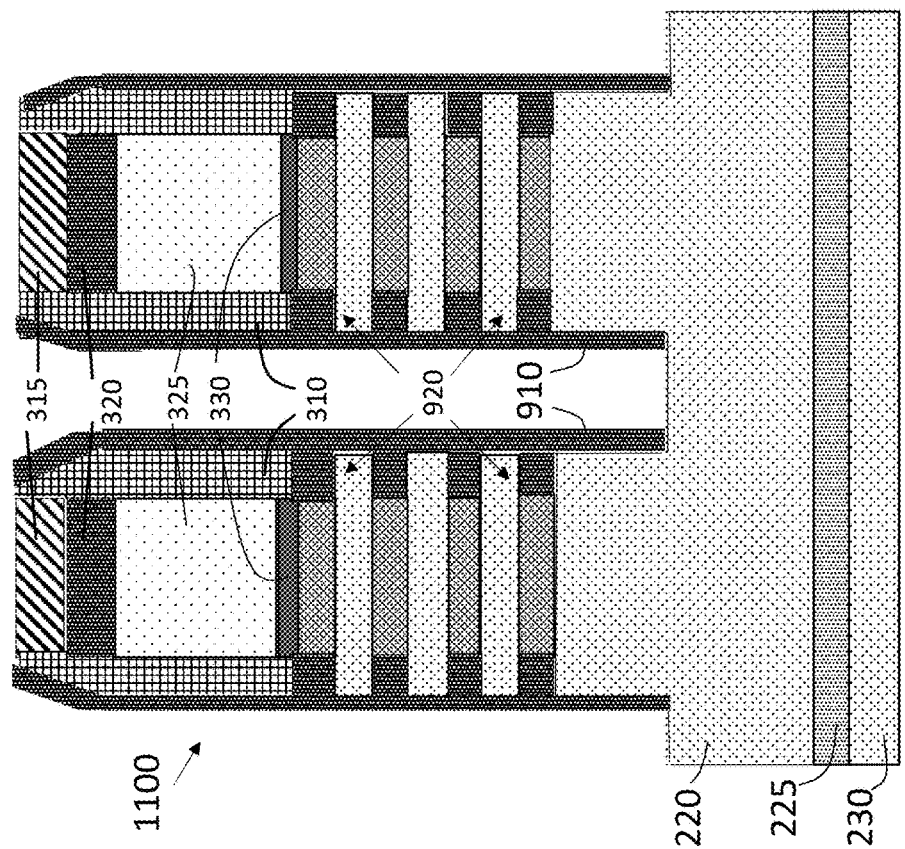

FIG. 11 shows the structure 1100 that results from an etch of the SiN liner 910 according to one or more embodiments.

Figure 12:
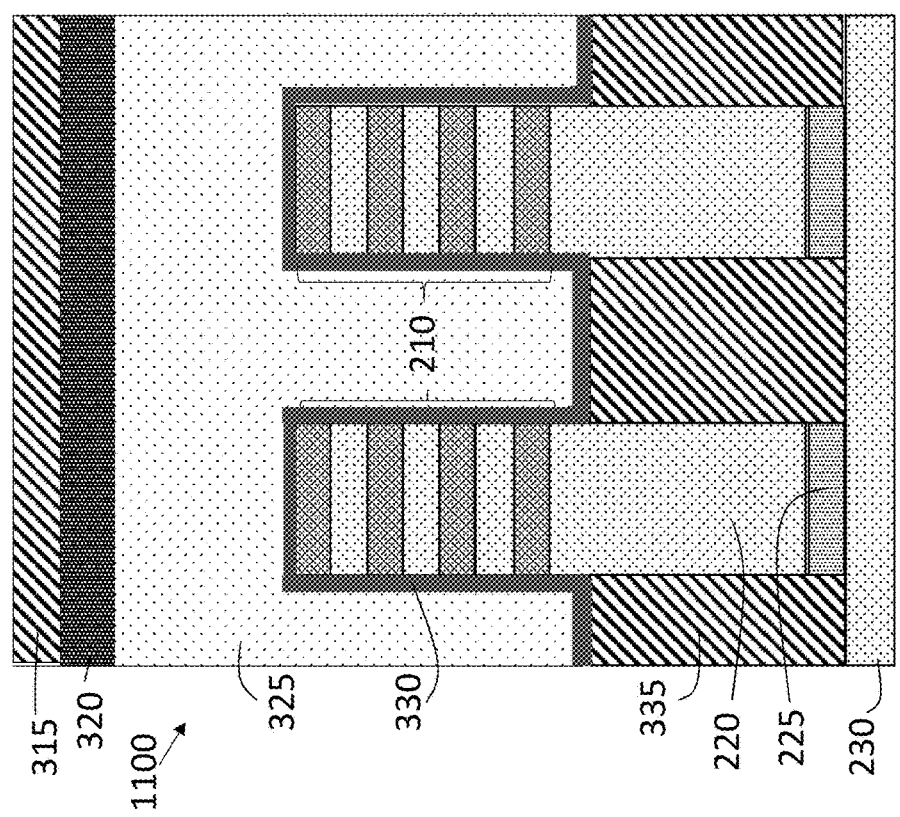

A directional RIE process is performed to etch only the surface portions of the SiN liner 910. As a result of the etch, the surface of the sacrificial Si layer 220 is exposed, as shown in FIG. 11. FIG. 12 shows aspects of the structure 1100 shown in FIG. 11. The SiN liner 910 is removed in the structure 1100, as shown. The directional RIE process that results in the structure 1100 is not performed in the conventional fabrication of a nanosheet FET.

Figure 14:
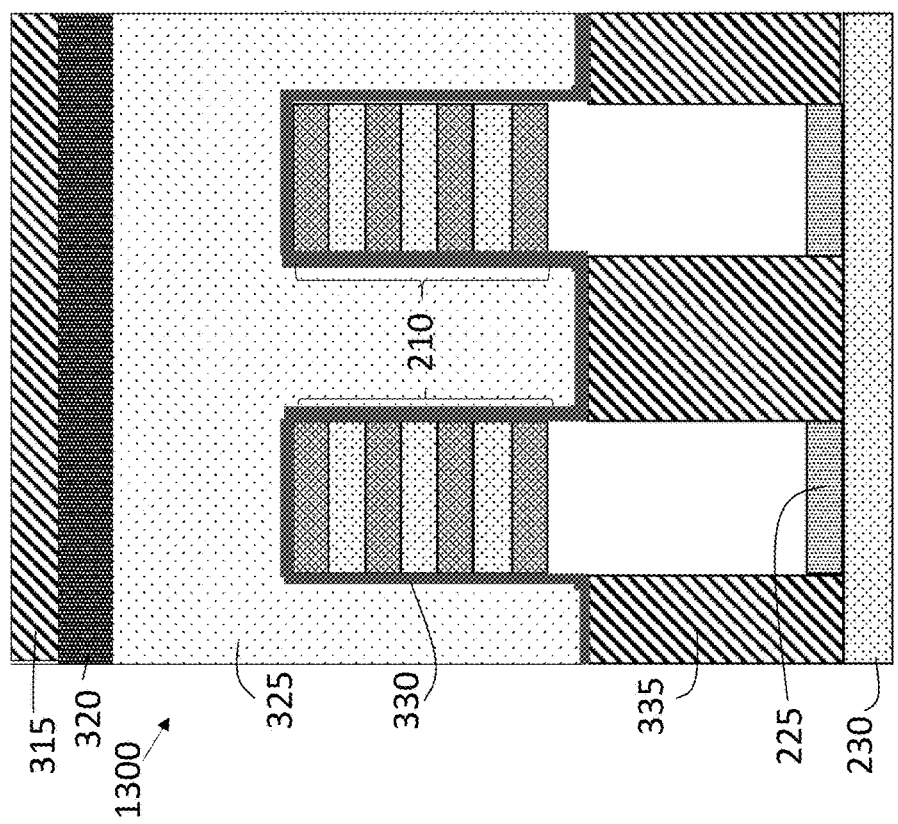
Figure 13:
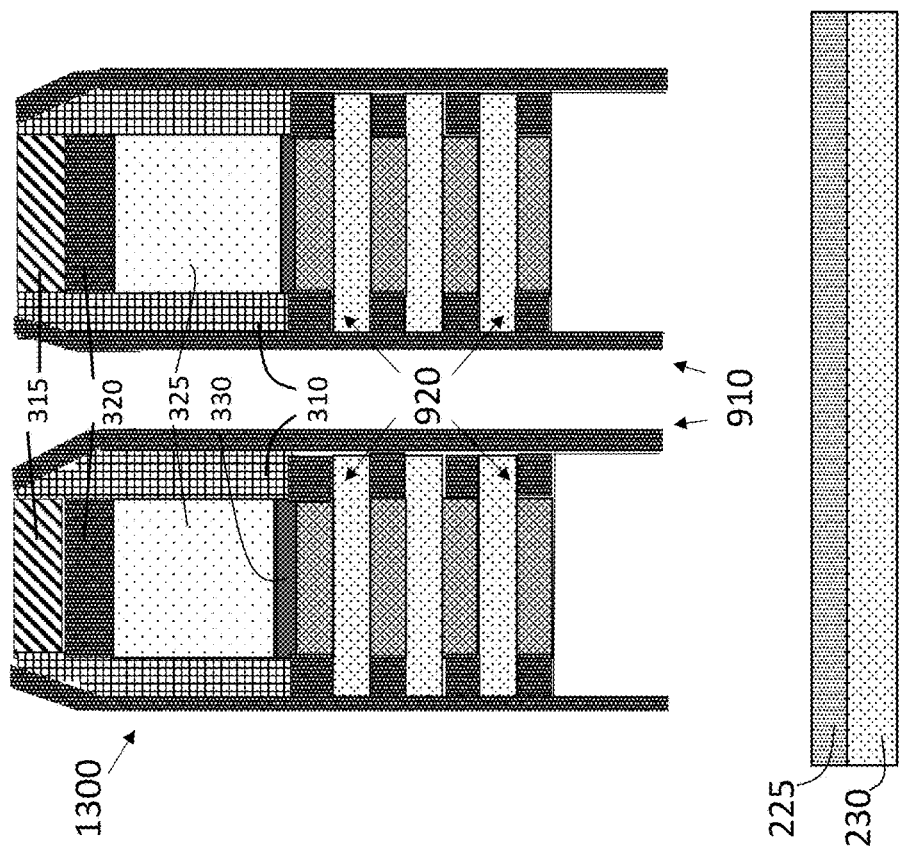

FIG. 13 shows the structure 1300 that results from etching the sacrificial Si layer 220. The highly selective etch can be a wet or dry etch and removes all of the sacrificial Si layer 220 (using, for example, diluted ammonia (NH$_4$OH)). The SiGe layer 225 acts as an etch stop. FIG. 14 shows aspects of the structure 1300 shown in FIG. 13. The sacrificial Si layer 220 below the nanosheet stack 210 is removed, as well, as shown in FIG. 14.

Figure 16:
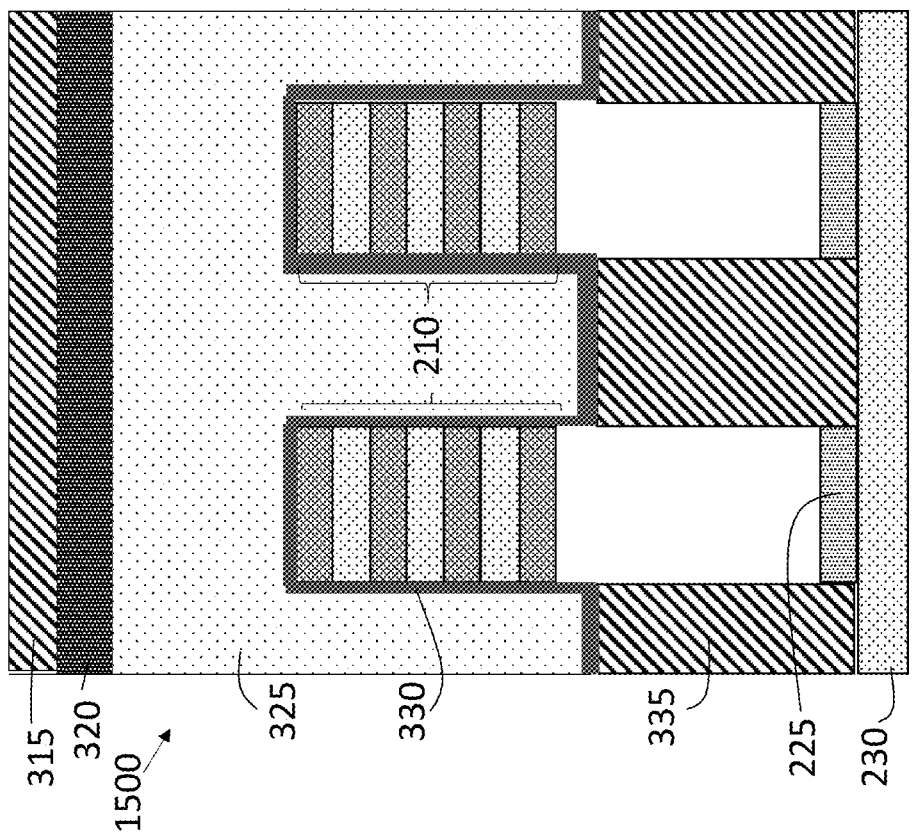
Figure 15:
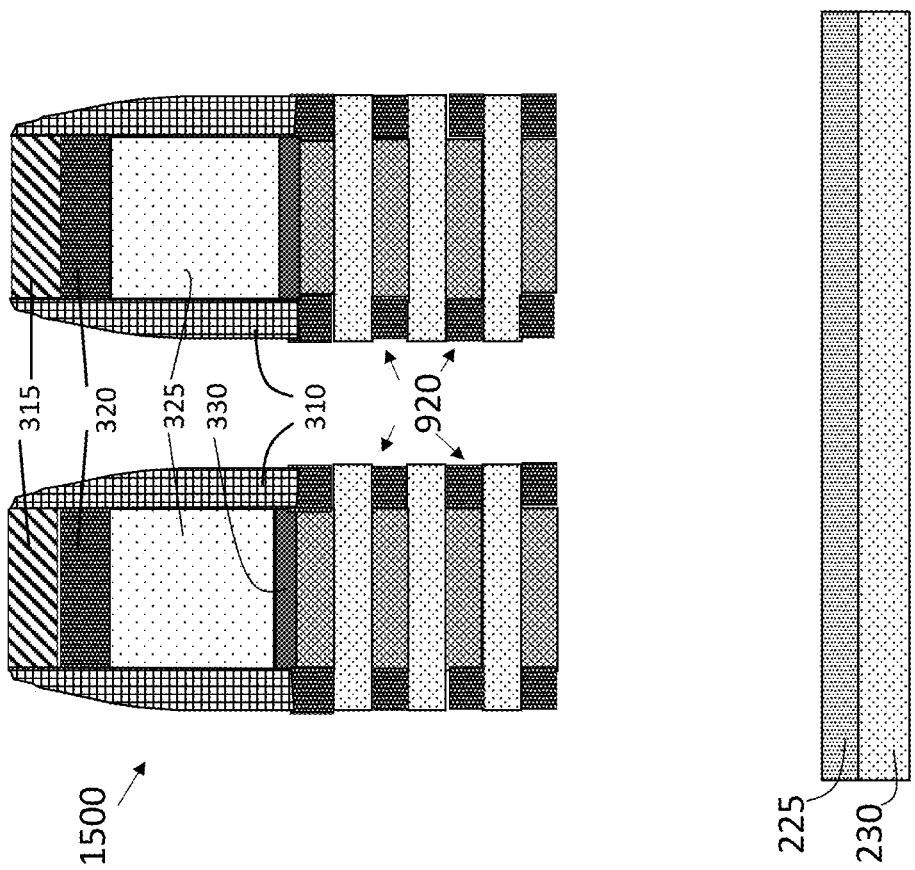

FIG. 15 shows the structure 1500 that results from removal of the SiN liner 910 according to one or more embodiments of the invention. An isotropic linear etch back is performed to remove the remaining SiN liner 910 from the structure 1300 shown in FIG. 13. FIG. 16 shows aspects of the structure 1500 shown in FIG. 15. From the perspective shown in FIG. 16, there is no change based on the removal of the remainder of the SiN liner 910.

Figure 18:
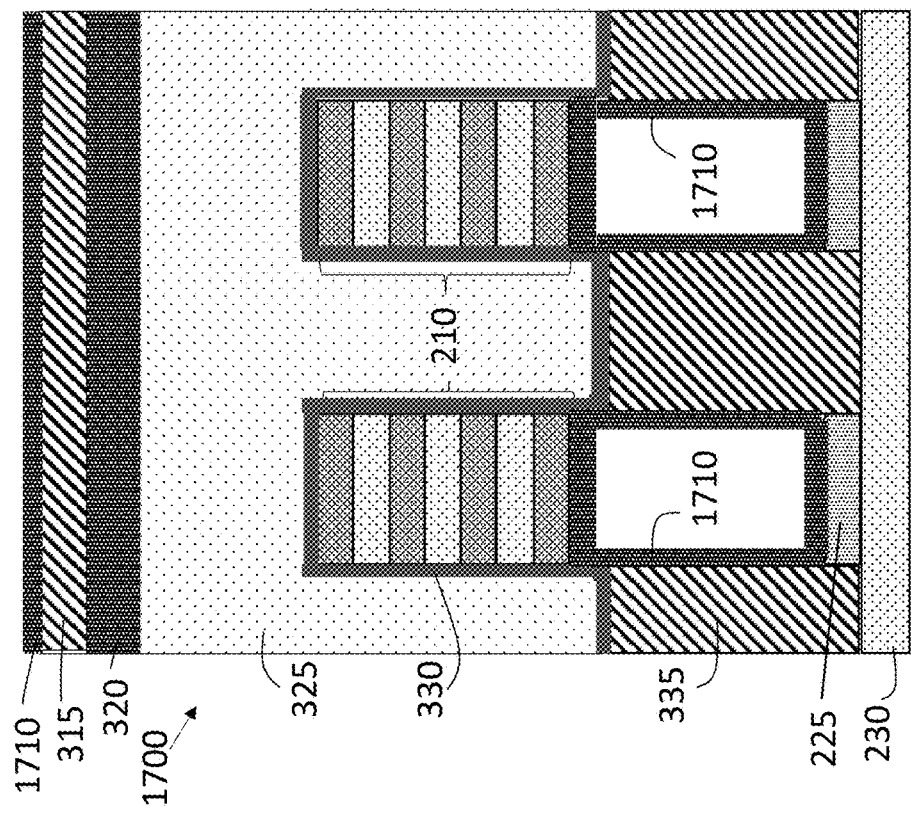
Figure 17:
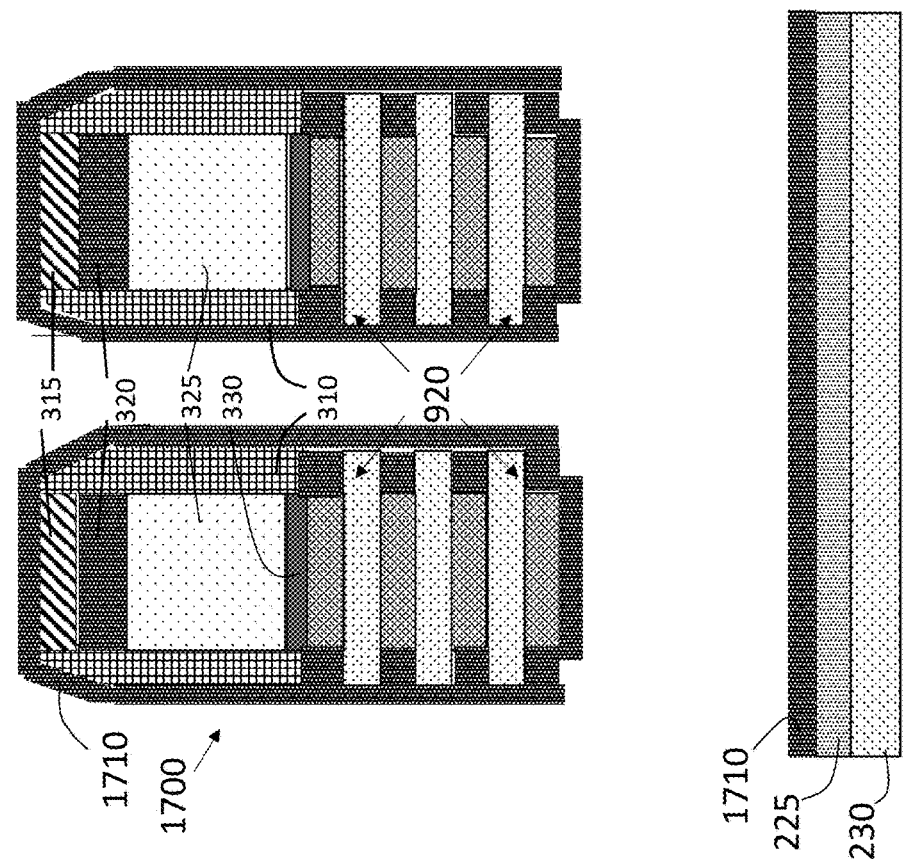

FIG. 17 shows the structure 1700 resulting from fin encapsulation according to one or more embodiments of the invention. An iRAD SiN liner 1710 is conformally formed on all the exposed surfaces of the structure 1500 shown in FIG. 15. FIG. 18 shows aspects of the structure 1700 shown in FIG. 17. As FIG. 18 indicates, the SiN liner 1710 is conformally formed above the SiO layer 315 and in the area below the nanosheet stack 210.

Figure 20:
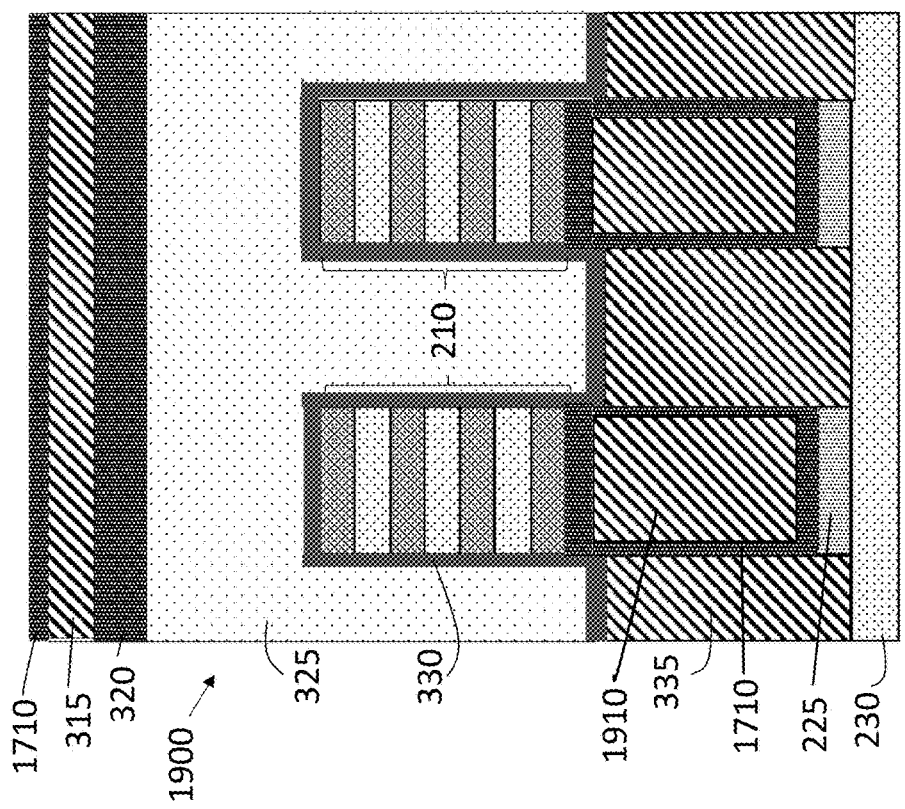
Figure 19:
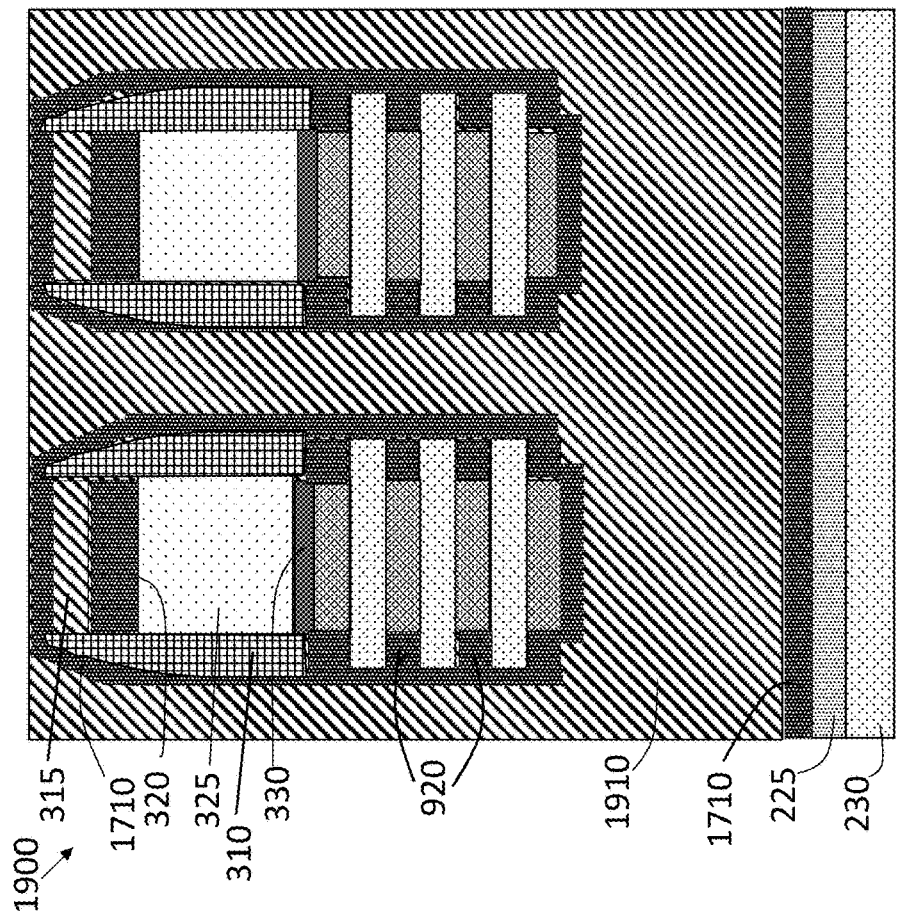

FIG. 19 shows the structure that results from an oxide fill according to one or more embodiments of the invention. Specifically, a flowable chemical vapor deposition (FCVD) process is used to deposit silicon dioxide (SiO$_2$) 1910. A chemical mechanical planarization (CMP) process is performed with the SiN liner 1710 acting as an etch stop. FIG. 20 shows aspects of the structure 1900 shown in FIG. 19. As FIG. 20 indicates, the FCVD SiO2 1910 fills the area within the conformal SiN liner 1710 below the nanosheet stack 210.

Figure 22:
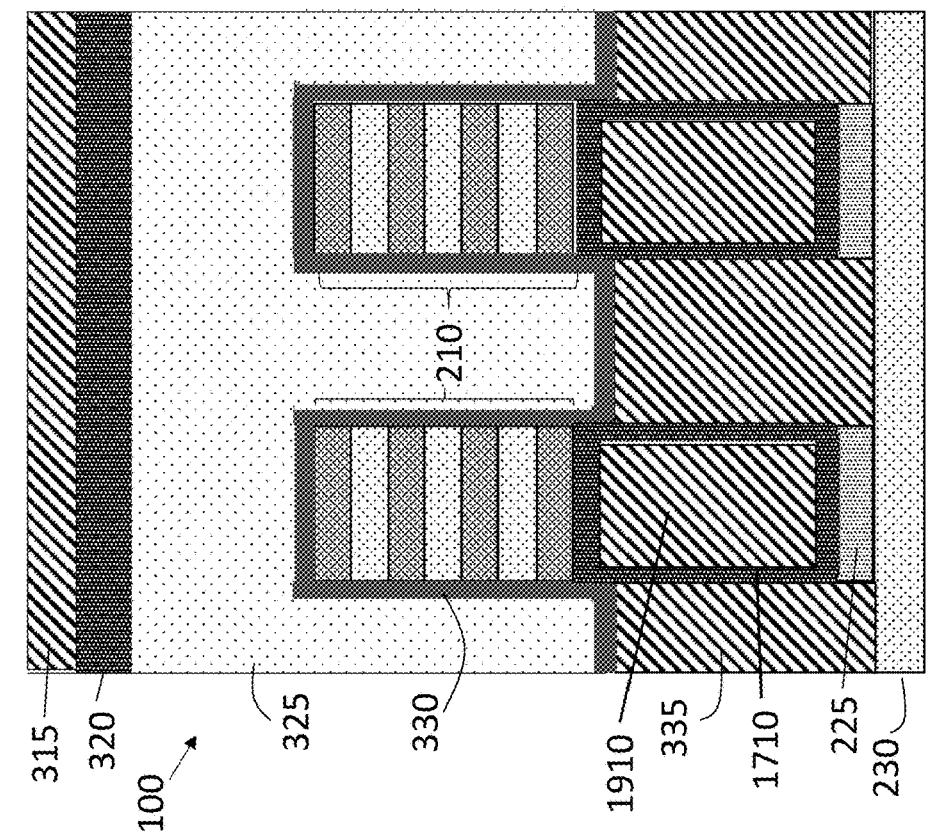
Figure 21:
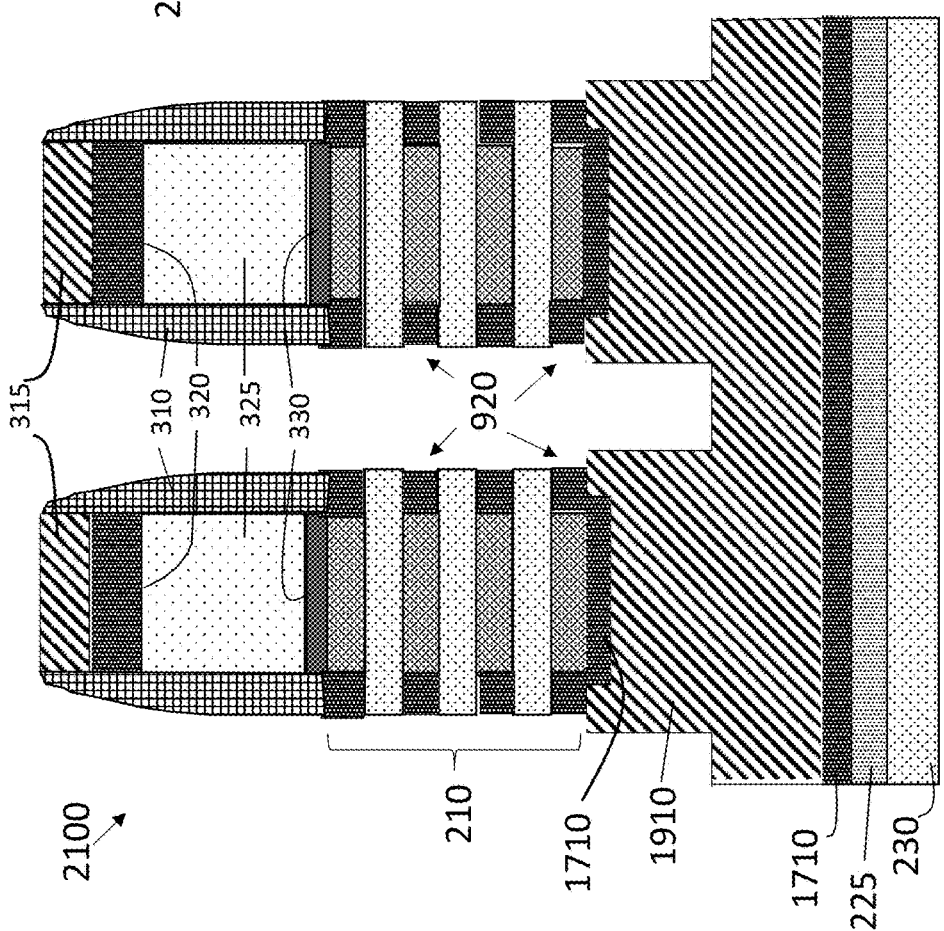

FIG. 21 shows the structure 2100 that results from an isotropic recess of the SiO2 1910 and an isotropic etch of the SiN liner 1710 according to one or more embodiments of the invention. A buffered oxide etch known as BHF using a buffering agent such as ammonium fluoride (NHF) can be used to recess the SiO2 1910. A hot phosphoric acid can be used to etch the SiN liner 1710. The remaining SiO2 1910 provides the desired BOX isolation layer between the source/drain regions 2310 (FIG. 23) and the substrate 230. FIG. 22 shows aspects of the structure 2100 shown in FIG. 21. As FIG. 21 indicates, the SiN liner 1710 below the nanosheet stacks 210 remains following the isotropic etch. According to the new processes illustrated by FIGS. 11 through 22, the pull-down of the SiN liner 910 to generate the structure 1100 in FIG. 11 facilitates the removal and replacement of the sacrificial Si layer 220 with the SiO$_2$ 1910 that acts as the BOX isolation layer according to one or more embodiments of the invention. The SiGe layer 225 above the substrate 230 is retained but is relatively much thinner than the BOX isolation layer defined by the SiO$_2$ 1910.

Figures 23, 24:
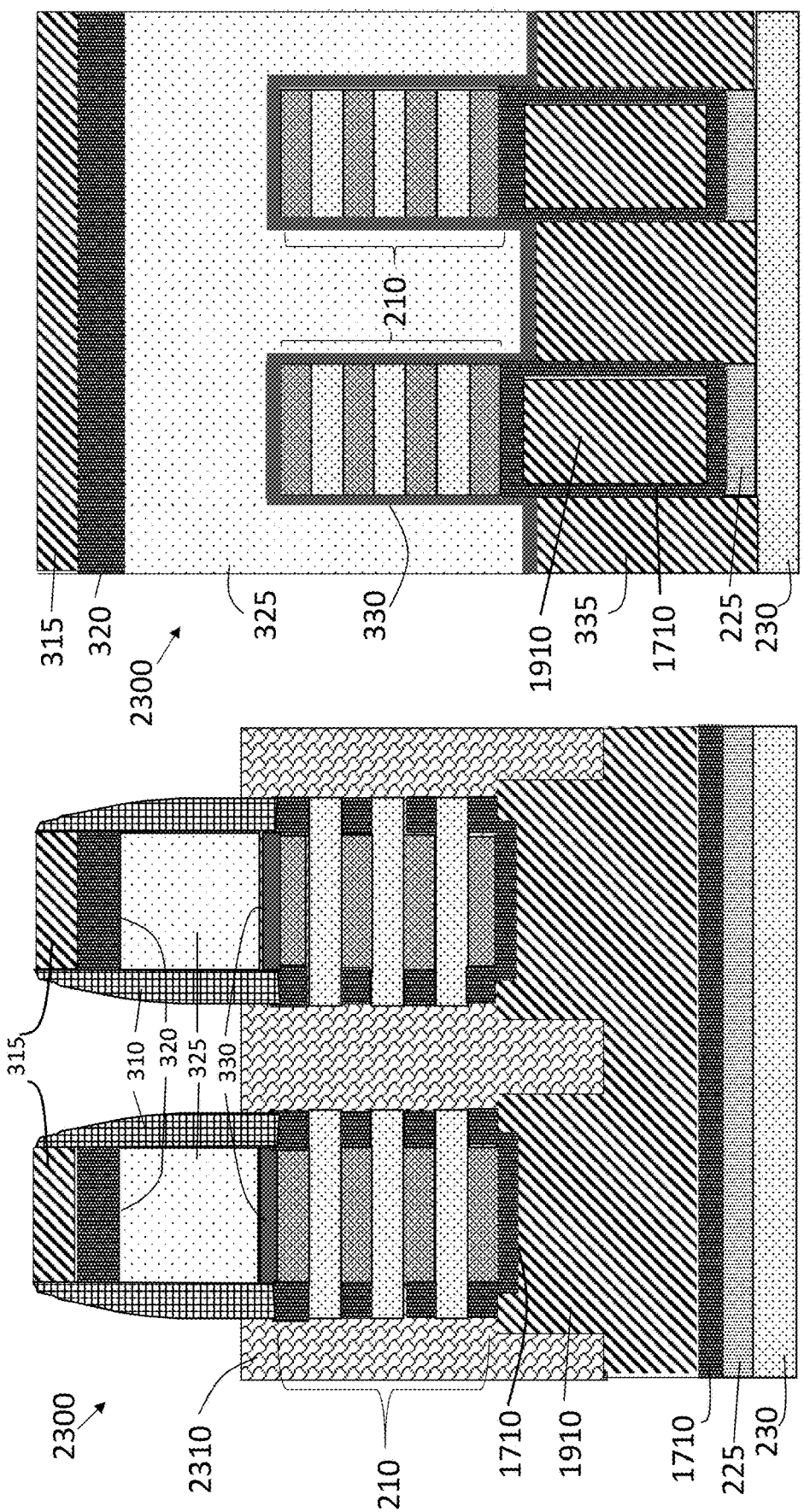
Figure 26:
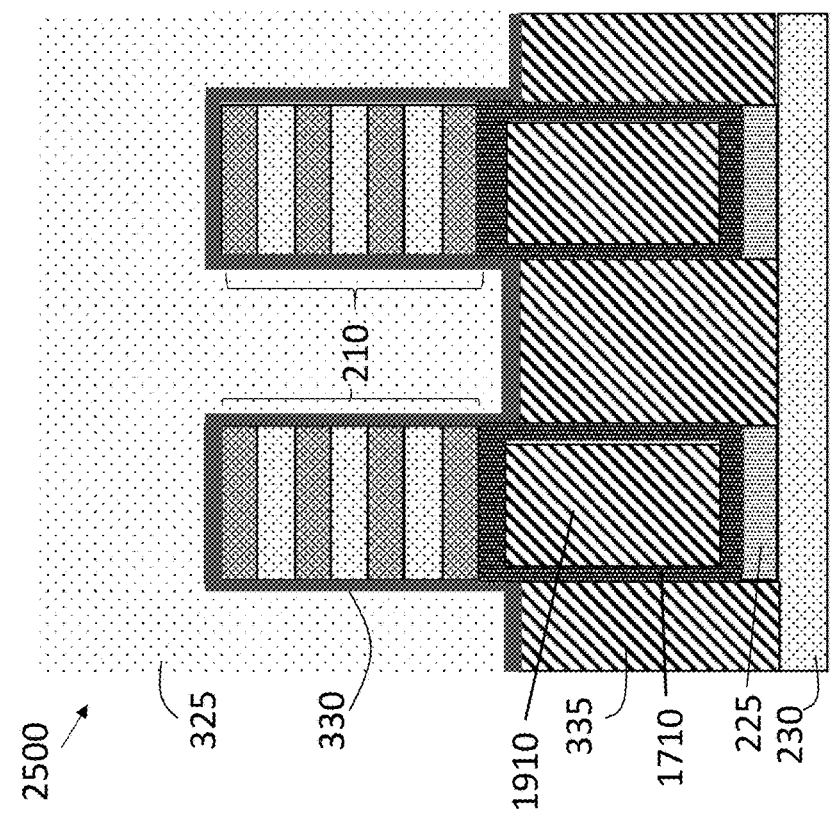
Figure 25:
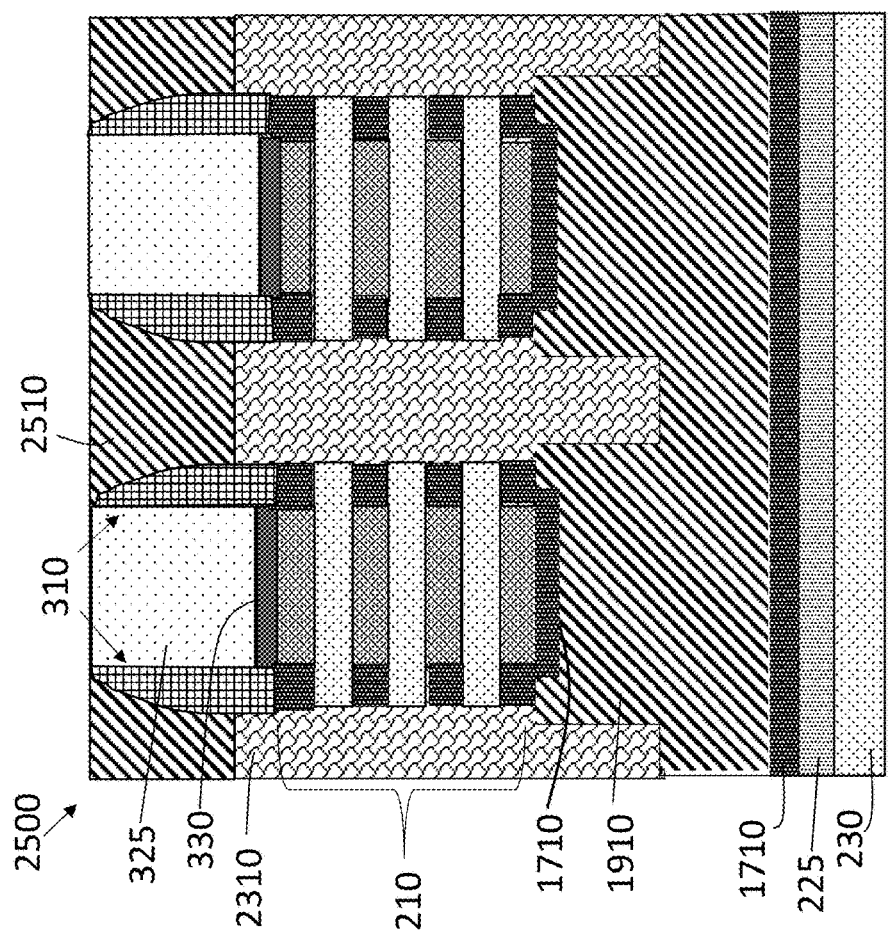

FIG. 23 shows the structure 2300 that results from dual epitaxy to grow the source/drain regions 2310 according to one or more embodiments of the invention. FIG. 24 shows aspects of the structure shown in FIG. 2300. The source/drain regions 2310 are in front of and behind the view shown in FIG. 24. FIG. 25 shows the structure 2500 that results from an oxide fill according to one or more embodiments of the invention. An interlayer dielectric oxide such as $SiO_2$ 2510 is deposited and a CMP process is performed. The amorphous Si 325 serves as an etch stop such that the SiO layer 315 and SiN layer 320 are removed. FIG. 26 shows aspects of the structure 2500 shown in FIG. 25. FIG. 26 shows the removal of the SiO layer 315 and SiN layer 320 above the amorphous Si 325.

Figure 28:
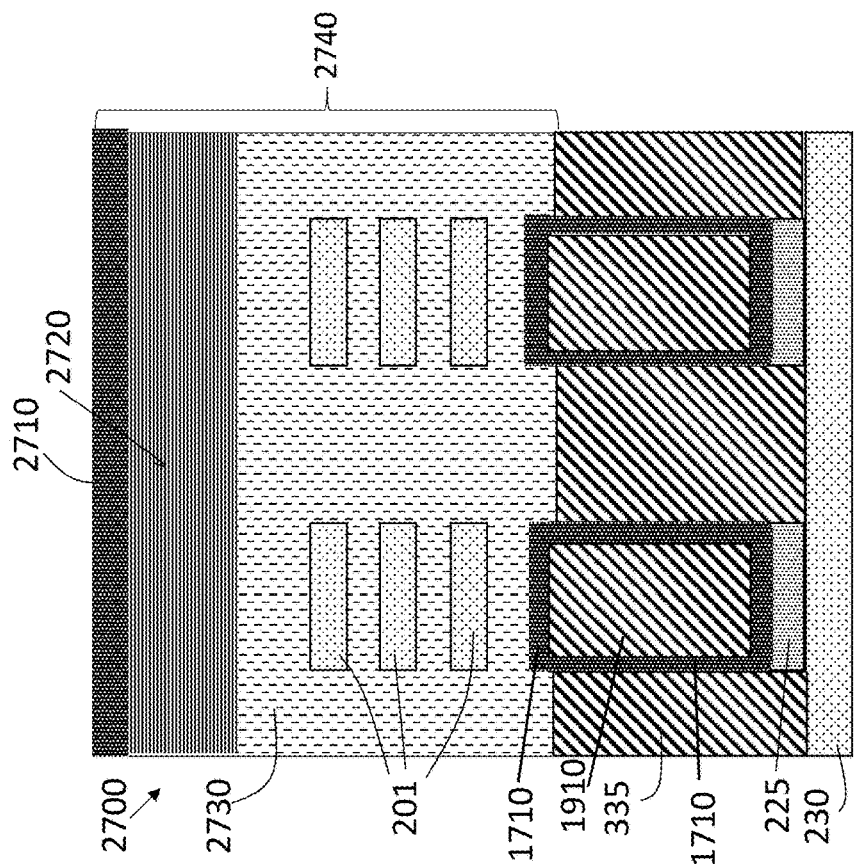
Figure 27:
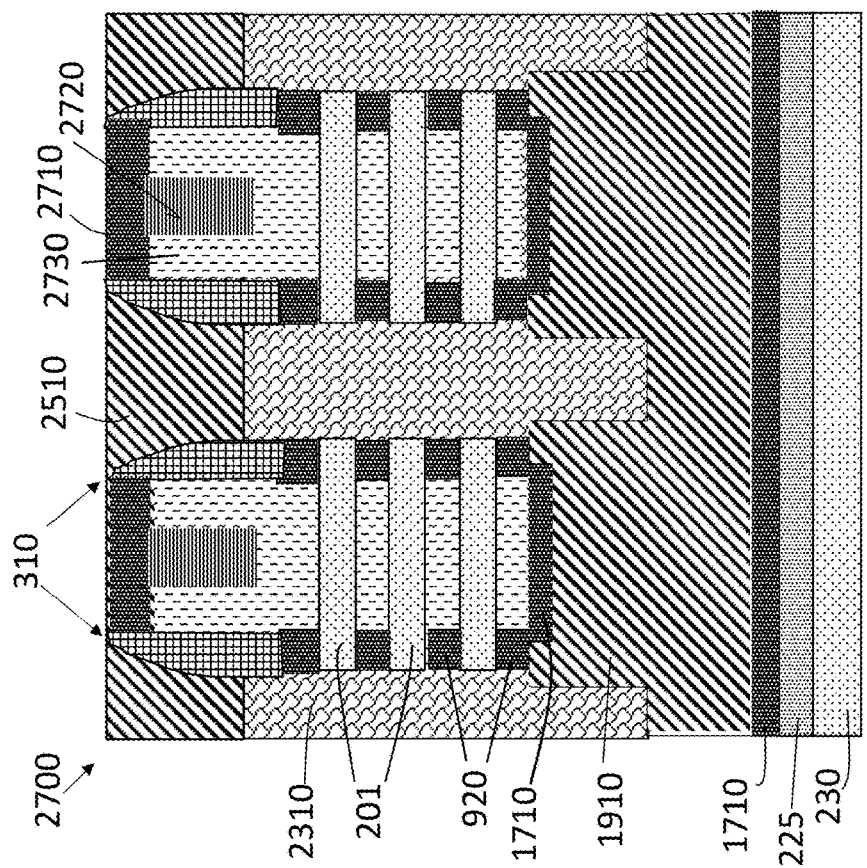

FIG. 27 shows the structure 2700 that results from gate 2740 formation according to one or more embodiments. The dummy gate structure including the amorphous Si 325 is removed based on a poly gate removal process. The oxide 330 strip and channel release are performed. The SiGe suspensions 205 are removed leaving the Si sheets 201 in the nanosheet stack 210. A high-k metal gate (HKMG) 2730 with a tungsten (W) gate fill 2720 is capped with a SiN cap 2710, as shown. These materials make up the gate 2740. FIG. 28 shows aspects of the structure 2700 shown in FIG. 27. The view in FIG. 28 shows the HKMG 2730 with the W gate fill 2720 and SiN cap 2710 above. As FIGS. 27 and 28 make clear, the Si sheets 201 are surrounded by the HKMG 2730 in the gate-all-around configuration.

Figure 30:
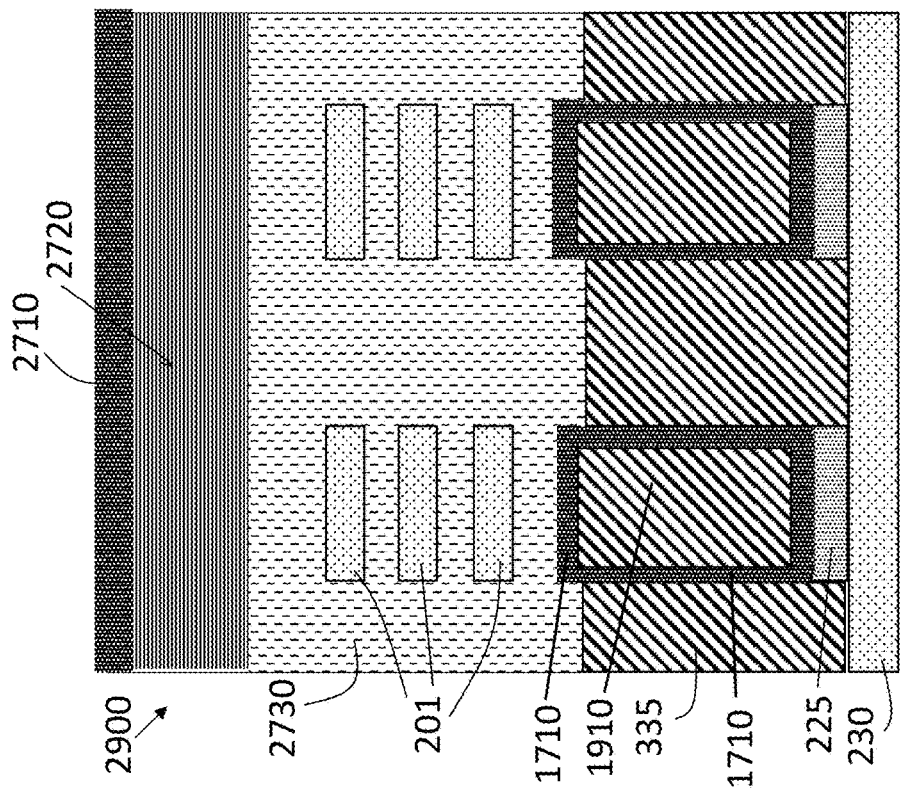
Figure 29:
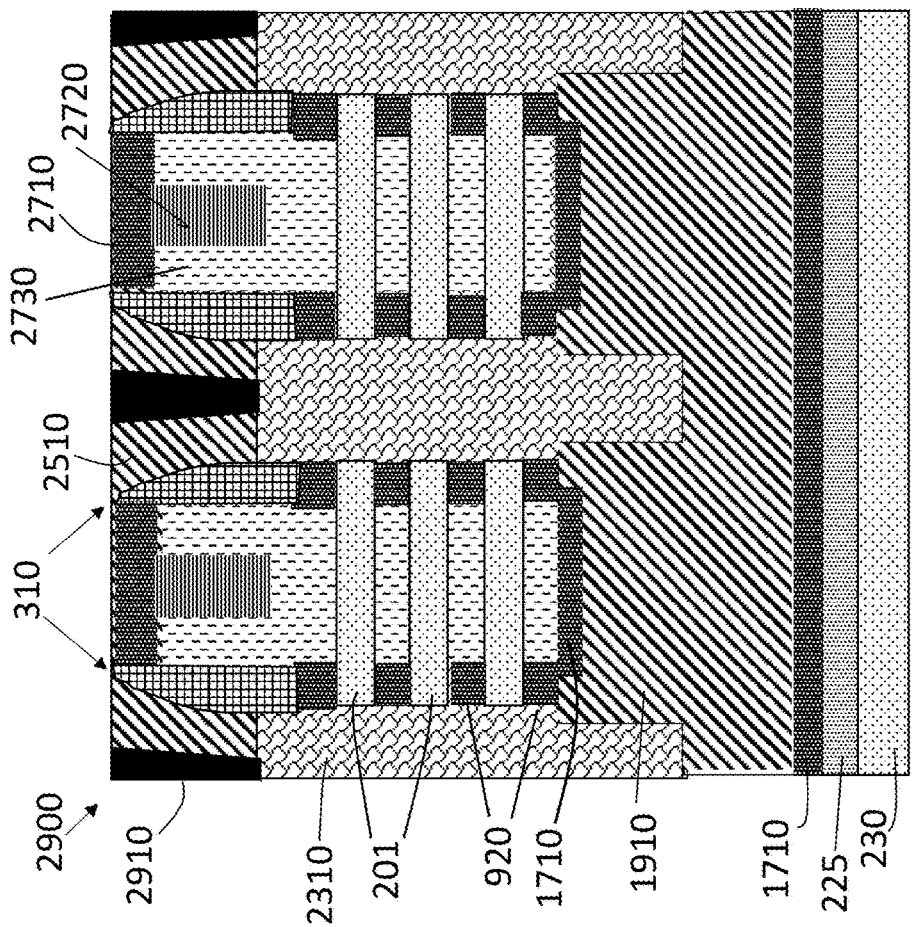

FIG. 29 shows the structure 2900 that results from formation of the contacts 2910 according to one or more embodiments of the invention. As shown, the contacts 2910 are formed above the source/drain regions 2310. FIG. 30 shows aspects of the structure 2900 shown in FIG. 29. The view shown in FIG. 30 is a cross-sectional view along the gate 2740. Thus, the source/drain regions 2310 are in front of and behind the cross-sectional view shown in FIG. 30 and the contacts 2910 are not visible in FIG. 30. As previously noted, according to one or more embodiments of the invention, the BOX isolation region defined by the SiO2 1910 separates the source/drain regions 2310 from the substrate 230. In addition, SiO2 fills the STI region 335 between the source/drain regions 2310.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a nanosheet semiconductor device, the method comprising:
   depositing sacrificial material on a layer of silicon germanium (SiGe) above a substrate, wherein a thickness of the sacrificial material is more than a thickness of the layer of SiGe;
   forming nanosheet fins comprising alternating silicon (Si) nanosheets and silicon germanium (SiGe) layers on the sacrificial material;
   undercutting the SiGe layers to form divots at a first end and a second end of each of the nanosheet fins;
   forming a dummy gate structure above each of the nanosheet fins;
   depositing a first liner to fill the divots and conformally cover the nanosheet fins and the dummy gate structure;
   removing the sacrificial material and removing the first liner material after removal of the sacrificial material;
   encapsulating the nanosheet fins and the dummy gate structure with a conformal liner; and performing an oxide fill to create a buried oxide (BOX) isolation between subsequently formed source and drain regions between the nanosheet fins and the substrate.

2. The method according to claim 1, wherein the depositing the sacrificial material includes controlling the thickness of the sacrificial material to be on the order of ten times the thickness of the layer of SiGe.

3. The method according to claim 1 further comprising depositing the conformal liner to surround the oxide fill below the nanosheet fins.

4. The method according to claim 1, wherein the forming the dummy gate structure includes depositing and etching spacers to define a region of the dummy gate structure.

5. The method according to claim 1 further comprising forming a recess in the oxide fill between the nanosheet fins.

6. The method according to claim 5 further comprising performing an epitaxy to grow the source region on one side of each of the nanosheet fins and the drain region on an opposite side of each of the nanosheet fins, in and above the recess.

7. The method according to claim 1 further comprising replacing the dummy gate structure with a gate structure above each of the nanosheet fins.

8. The method according to claim 7 further comprising removing the SiGe layers of the nanosheet fins.

9. The method according to claim 8 further comprising depositing a gate metal as part of the gate structure and to fill gaps resulting from removal of the SiGe layers to create a gate-all-around configuration.

10. The method according to claim 1 further comprising forming contacts above the source and drain regions.

11. A nanosheet semiconductor device, comprising:
an oxide above a silicon germanium (SiGe) layer formed on a substrate, wherein a thickness of a thinnest portion of the oxide is more than a thickness of the SiGe layer;
silicon (Si) nanosheets formed above a thickest portion of the oxide, wherein a gap between adjacent ones of the Si nanosheets is filled on a first end and a second end with a liner material;
a source region adjacent the first end of the Si nanosheets and a drain region adjacent the second end of the Si nanosheets, wherein the source region and the drain region are formed on the thinnest portion of the oxide; and
a second liner material between the SiGe layer and the oxide.

12. The device according to claim 11, wherein a thickness of the thinnest portion of the oxide is on an order of ten times the thickness of the SiGe layer.

13. The device according to claim 11, wherein the oxide below the Si nanosheets is surrounded by the second liner material.

14. The device according to claim 11 further comprising a gate formed above the Si nanosheets.

15. The device according to claim 14, wherein the gate includes a gate metal and a fill metal.

16. The device according to claim 15, wherein the gap between the adjacent ones of the Si nanosheets is filled with the gate metal between the liner material on the first end and the second end.

17. The device according to claim 14, wherein the gate is formed between spacers.

18. The device according to claim 11, wherein the oxide is silicon dioxide.

19. The device according to claim 11 further comprising contacts formed above the source region and the drain region.

* * * * *